United States Patent
Kobayashi (10) Patent No.: US 6,767,790 B2
(45) Date of Patent: Jul. 27, 2004

(54) METHODS OF WRITING/ERASING OF NONVOLATILE SEMICONDUCTOR STORAGE DEVICE

(75) Inventor: Kiyoteru Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/196,170

(22) Filed: Jul. 17, 2002

(65) Prior Publication Data

US 2003/0054609 A1 Mar. 20, 2003

(30) Foreign Application Priority Data

Sep. 12, 2001 (JP) .................................. 2001-276420

(51) Int. Cl.[7] .................... H01L 21/336; G11C 16/04
(52) U.S. Cl. .............. 438/257; 365/185.14; 365/185.29
(58) Field of Search .................. 365/185.14, 185.29, 365/189.04, 185.33; 438/257, 593

(56) References Cited

U.S. PATENT DOCUMENTS

| 6,438,028 B1 | * | 8/2002 | Kobayashi et al. | .... | 365/185.05 |
| 2002/0191458 A1 | * | 12/2002 | Kabayashi et al. | ......... | 365/200 |

FOREIGN PATENT DOCUMENTS

| EP | 1 069 619 A2 | 1/2001 |
| JP | 2001-028428 | 1/2001 |
| JP | 2001-85540 | 3/2001 |
| JP | 2001-85541 | 3/2001 |

OTHER PUBLICATIONS

Wolf et al., "Silicon Processing for the VLSI ERA vol. 2", 1990, Lattice Press, pp. 628–635.*

* cited by examiner

Primary Examiner—Matthew Smith
Assistant Examiner—Lex H. Malsawma
(74) Attorney, Agent, or Firm—Oblon, Spivak, McClelland, Maier & Neustadt, P.C.

(57) ABSTRACT

A nonvolatile semiconductor storage device can achieve a shortened write time and a reduced absolute value of an operating voltage at the time of erasing. A P-type silicon substrate (1) is set at a ground level, a control gate (109) is set at a high voltage (Vp1), and a voltage of 0 V is applied to an access gate line connected in common to all access gates (7a) to set all the access gates (7a(n-4) to 7a(n+3)) at 0 V. When the threshold voltage of a memory transistor (MT(n)) is set into a written state, an N$^+$ diffusion region (5(n)) is set at 0V. This causes tunnel injection of electrons into a floating gate (3a(n)) of the memory transistor (MT(n)) and thereby allows the memory transistor MT(n) to be set to a high threshold voltage (Vthp) without being influenced by the contents of writing to adjacent memory transistors.

6 Claims, 10 Drawing Sheets

METHODS OF WRITING/ERASING OF NONVOLATILE SEMICONDUCTOR STORAGE DEVICE

BACKGROUND OF THE INVENTION

1. Field of the Invention

The present invention relates to a nonvolatile semiconductor storage device, and especially to writing/erasing of memory cells in a flash memory.

2. Description of the Background Art

Of electrically rewritable nonvolatile semiconductor storage devices, flash memories capable of erasing the entire or a block of data by one operation are well known in the art. Such flash memories are disclosed for example in Japanese Patent Application Laid-open Nos. 2001-28428, 2001-85540, and 2001-85541.

FIGS. 6 to 13 are cross-sectional views illustrating a method of manufacturing a group of memory transistors (memory cells) in a conventional flash memory. Referring to the drawings, the manufacturing procedure will be described hereinbelow.

Figure 6:
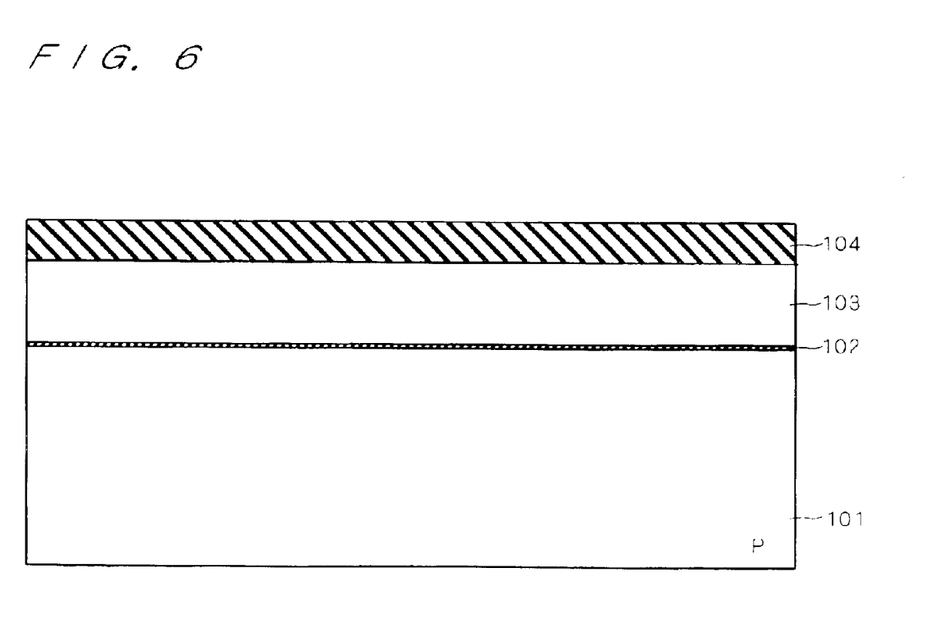
FIGS. 6 to 13 are cross-sectional views illustrating a method of manufacturing a memory cell group in a conventional flash memory.

Initially, as shown in FIG. 6, a silicon oxide film 102 is grown to a thickness of about 100 angstroms by thermal oxidation on the surface of a P-type silicon substrate 101 having a (001) crystal orientation, and then a phosphorus-doped polycrystalline silicon layer 103 is deposited by low-pressure CVD to a thickness of about 2000 angstroms. Following this, a silicon oxide film 104 is deposited to a thickness of about 1500 angstroms by low-pressure CVD.

Figure 7:
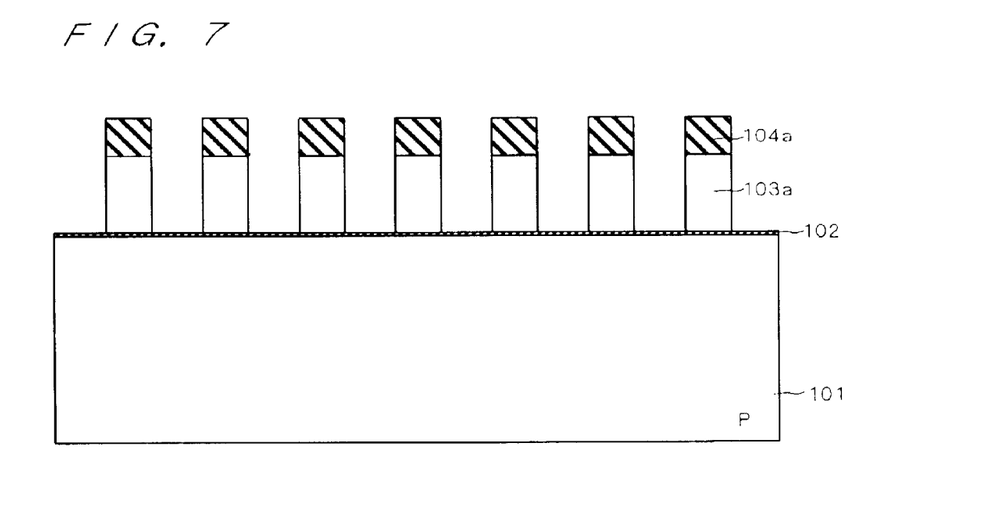

After a predetermined pattern of resist (not shown) is formed by photolithography techniques, as shown in FIG. 7, the silicon oxide film 104 is etched using the resist as a mask, thereby to obtain a patterned silicon oxide film 104a. Using the silicon oxide film 104a as a mask, the phosphorus-doped polycrystalline silicon layer 103 is patterned to form a plurality of floating gates 103a.

Figure 8:
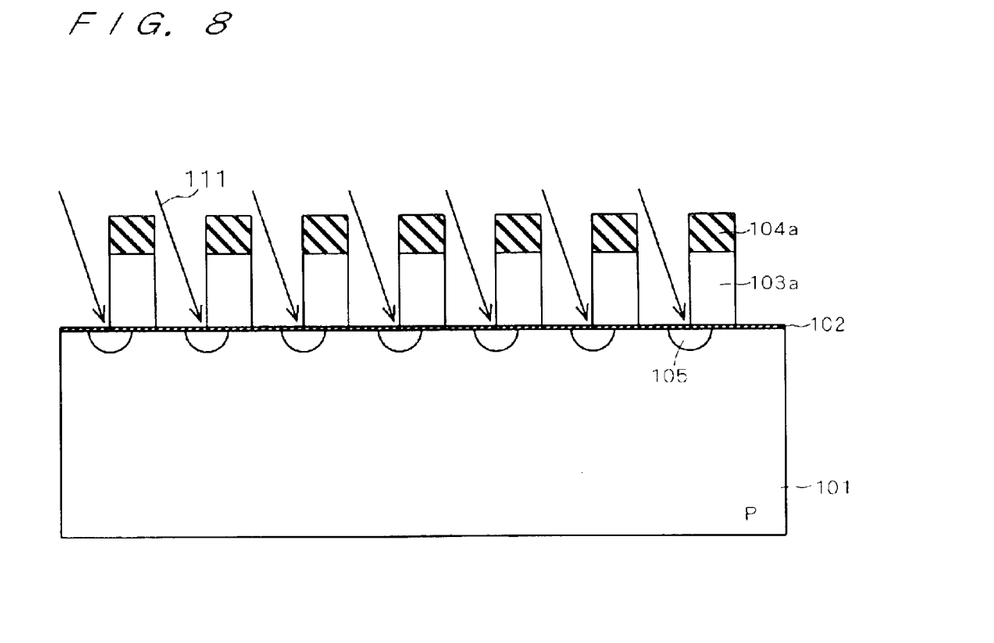

Then, arsenic ions 111 are angularly implanted at an implant energy of 40 keV and a dose of $5 \times 10^{15}$ cm$^{-2}$ as shown in FIG. 8, and the annealing is carried out in a nitrogen atmosphere, whereby N$^+$ diffusion regions 105 of memory transistors are formed. At this time, parts of the N$^+$ diffusion regions 105 are formed under the floating gates 103a.

Figure 9:
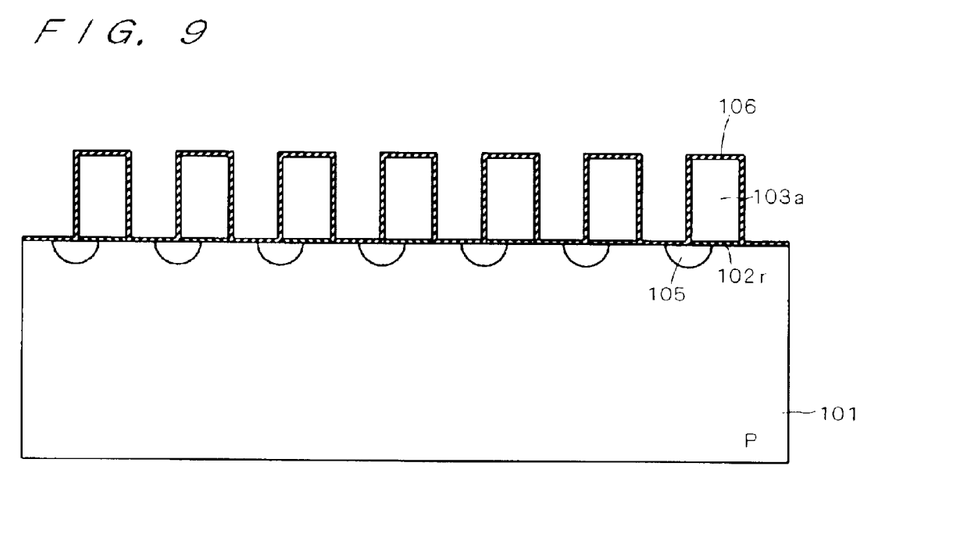

As shown in FIG. 9, exposed portions of the silicon oxide film 102 and the silicon oxide film 104 are removed by etching in a HF solution, so that only the silicon oxide film 102 directly below the floating gates 103a remain as silicon oxide films 102r. Further, a three-layer insulating film 106, consisting of a silicon oxide film of about 50 angstroms thick, a silicon nitride film of about 100 angstroms thick, and a silicon oxide film of about 50 angstroms thick, is deposited over the whole surface by low-pressure CVD.

Figure 10:
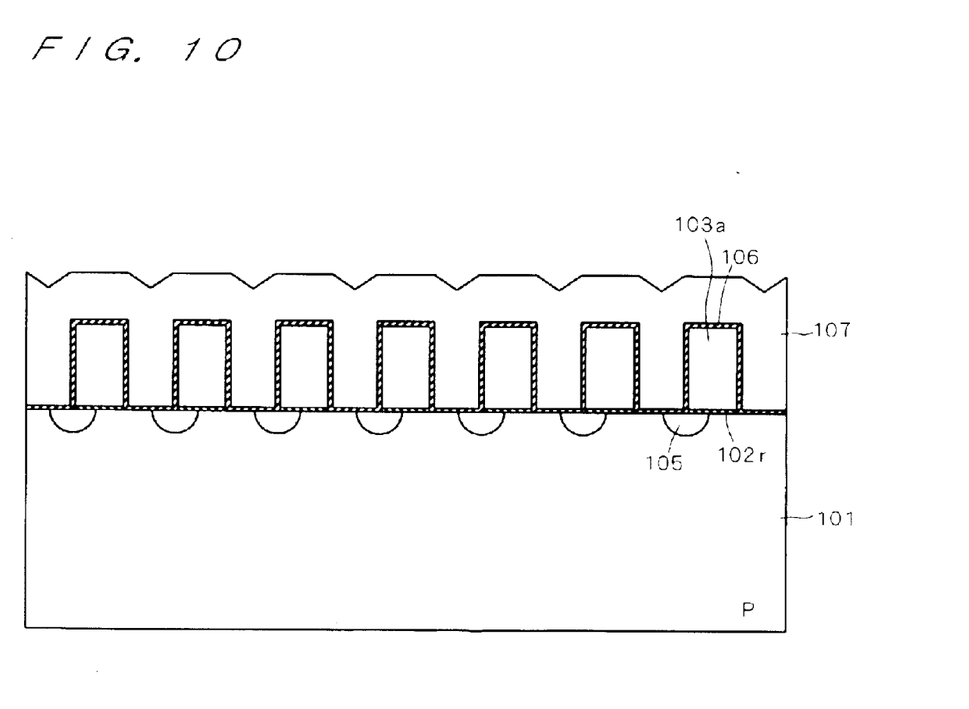

Following this, as shown in FIG. 10, a phosphorus-doped polycrystalline silicon layer 107 is deposited over the whole surface to a thickness of about 1000 angstroms by low-pressure CVD.

Figure 11:
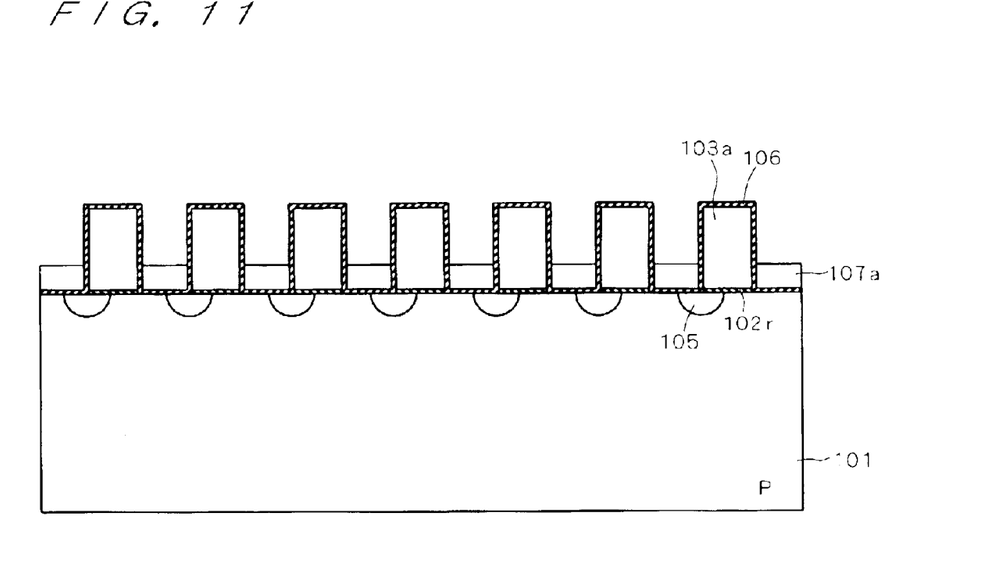

The phosphorus-doped polycrystalline silicon layer 107 is, as shown in FIG. 11, etched back so that only the portions thereof on the three-layer insulating film 106 where the floating gates 103a are not formed, remain as a plurality of access gates 107a. Thus the other parts of the N$^+$ diffusion regions 105 are located under the access gates 107a. That is, the N$^+$ diffusion regions 105 each are formed under one floating gate 103a and one access gate 107a to extend thereacross.

Figure 12:
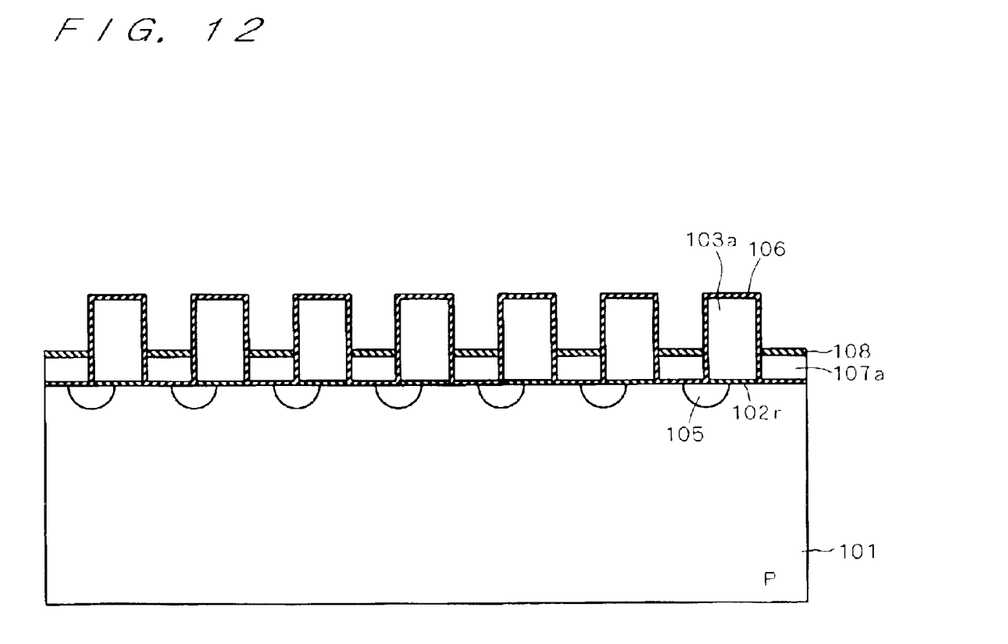

The surfaces of the access gates 107a are thermally oxidized to form a silicon oxide film 108 of about 300 angstroms thick, as shown in FIG. 12.

Figure 13:
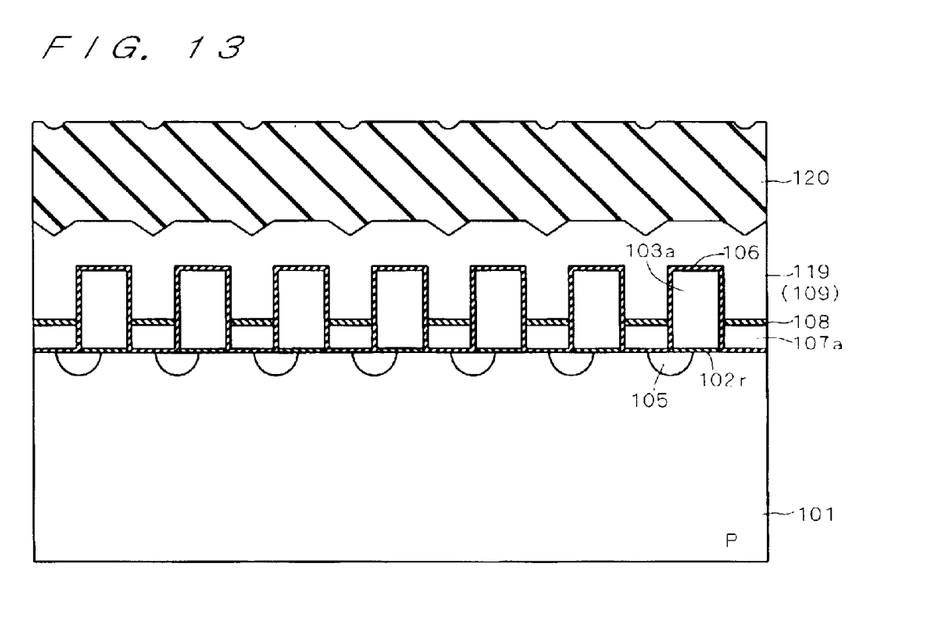

Then, as shown in FIG. 13, a phosphorus-doped polycrystalline silicon layer 119 of about 2000 angstroms thick and a silicon oxide film 120 of about 2200 angstroms thick are successively deposited by low-pressure CVD.

After a predetermined pattern of resist (not shown) is formed on the silicon oxide film 120 by photolithography techniques, the silicon oxide film 120 is etched using the resist as a mask and the resist is removed. Further, the phosphorus-doped polycrystalline silicon 119 is etched using the silicon oxide film 120 as a mask, whereby a control gate 109 is formed.

Figure 14:
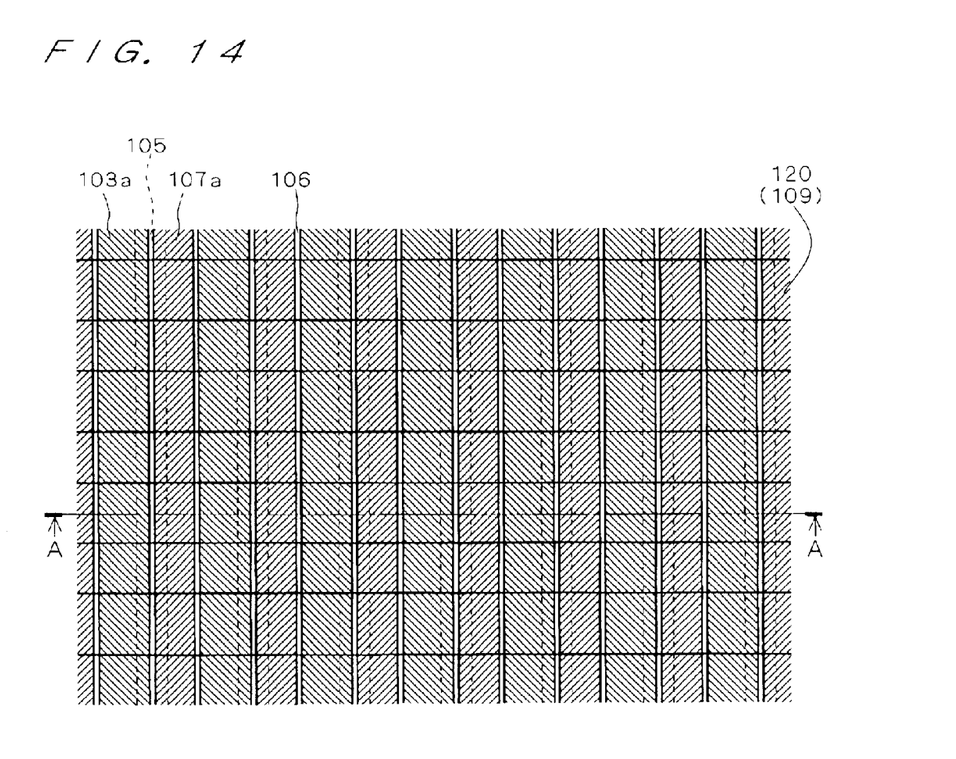
FIG. 14 is a plan view illustrating the method of manufacturing a memory cell group in a conventional flash memory.

FIG. 14 is a plan view illustrating a plan configuration after the formation of the control gate 109. As shown, a plurality of lines of control gates 109 are formed, each extending from side to side. FIG. 13 is the equivalent of a cross section of FIG. 14 taken along the line A—A.

Figure 15:
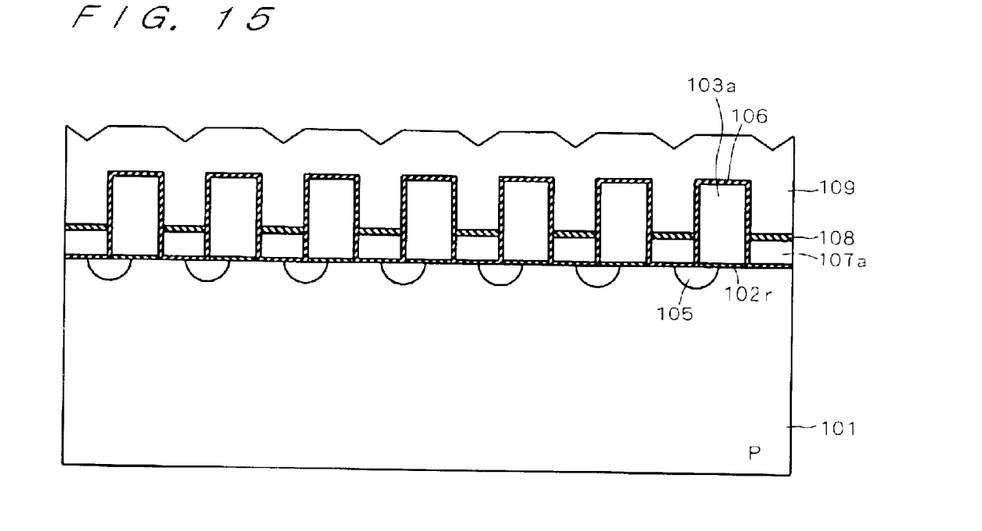
FIG. 15 is a cross-sectional view illustrating the method of manufacturing a memory cell group in a conventional flash memory.
Figure 16:
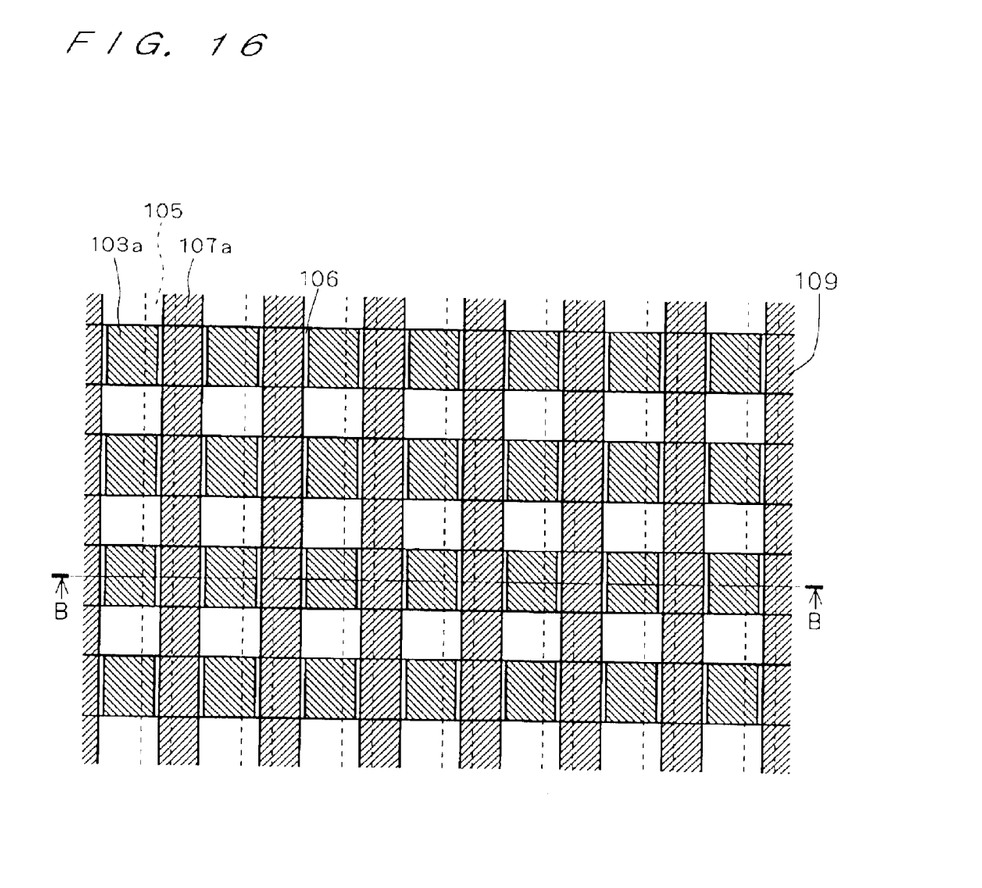
FIG. 16 is a plan view illustrating the method of manufacturing a memory cell group in a conventional flash memory.

As illustrated in the cross-sectional view of FIG. 15 and the plan view of FIG. 16, the three-layer insulating film 106 formed on the floating gates 103a, and the floating gates 103a are removed by etching using the silicon oxide film 120 as a mask. Thereby the patterning of the floating gates 103a is completed and the silicon oxide film 120 is removed. FIG. 16 is the equivalent of a cross section of FIG. 15 taken along the line B—B.

In this fashion, one memory transistor is formed of the control gate 109, a set of one floating gate 103a and one access gate 107a that are adjacent to each other with the three-layer insulating film 106 sandwiched in between, and a pair of N$^+$ diffusion regions 105, parts of which are formed under the above set of one floating gate 103a and one access gate 107a. By forming a plurality of such memory transistors adjacent to one another, a group of memory transistors can be obtained.

Referring to FIG. 13, for example, one memory transistor MT(n) is formed of the control gate 109, a floating gate 103a(n), an access gate 107a(n), and N$^+$ diffusion regions 105(n) and 105(n+1).

The plurality of N$^+$ diffusion regions 105 are configured such that their respective potentials can be set individually for reasons of necessity to perform a write operation for each memory transistor. The plurality of access gates 107a are configured such that at least adjacent access gates 107a can be set at different potentials for reasons of necessity to ensure normal write operations.

For instance, the plurality of access gates 107a are configured such that the potentials of a group of access gates {107a(n−3), 107a(n−1), 107a(n+1), and 107a(n+3)} and a group of access gates {107a(n−2), 107a(n), and 107a(n+2)} can be set on an individual basis.

In the flash memory with such a memory transistor structure, the contents of information to be stored in each memory transistor is determined according to whether the memory transistor has a high threshold voltage Vthp due to electron injection in its floating gate 103a or has a low threshold voltage Vthe due to electron emission from its floating gate 103a.

A memory transistor that has a high threshold voltage Vthp due to electron injection in its floating gate 103a is regarded as being in a written state. Since electrons stored in the floating gate 103a will not be destroyed semi-permanently unless they are forcedly emitted for example by an erase operation, information stored therein is also semi-permanent. A memory transistor that has a low threshold voltage Vthe due to electron emission from its floating gate 103a, on the other hand, is regarded as being in an erased state.

By detecting the state of each memory transistor, either "written" or "eased", information stored in the memory transistor (memory cell) can be read.

Figure 17:
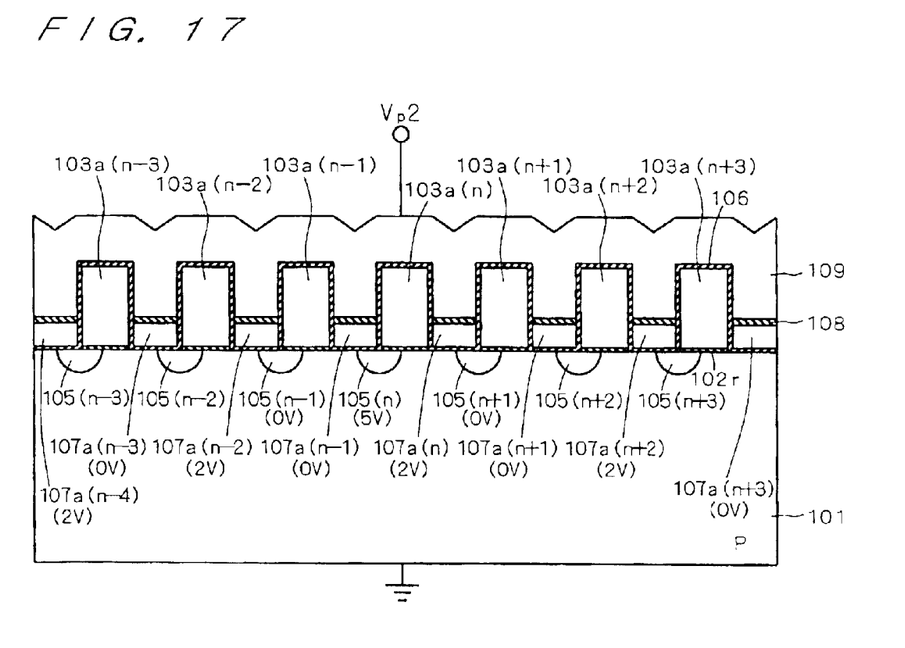
FIG. 17 is a cross-sectional view for explaining a write operation in a conventional flash memory.

FIG. 17 is a cross-sectional view for explaining a write operation on memory cells in a conventional flash memory. Referring to the drawing, the write operation on the memory cells will be described hereinbelow.

Figure 18:
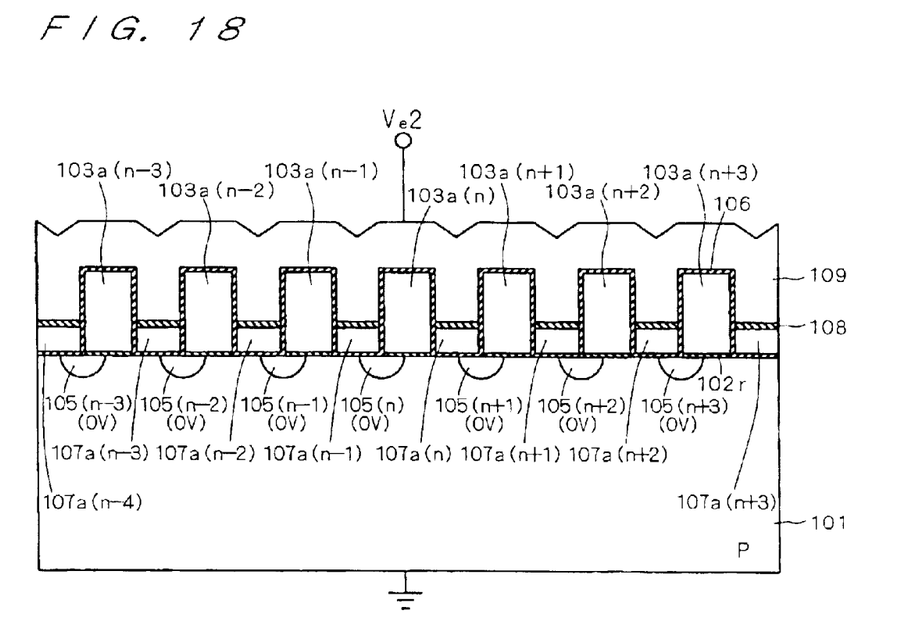
FIG. 18 is a cross-sectional view for explaining an erase operation in a conventional flash memory.

For convenience of explanation, the plurality of floating gates 103a are designated by 103a(n−3) to 103a(n+3), the plurality of N⁺ diffusion regions 105 by 105(n−3) to 105(n+3), and the plurality of access gates 107a by 107a(n−4) to 107a(n+3) (the same applies to FIG. 18).

The n-th memory transitory MT(n) is formed of the control gate 109, the floating gate 103a(n), the access gate 107a(n), and the N⁺ diffusion regions 105(n) and 105(n+1).

In this configuration, a write operation on the memory transistor MT(n) is performed by applying a high voltage Vp2 (approximately 12 V) to the control gate 109, grounding the P-type silicon substrate 101, and setting the access gate 107a(n) at 2V and the access gates 107a(n−1) and 107a(n+1) at 0V.

In writing for setting the memory transistor MT(n) to a high threshold voltage Vthp, for example, the N⁺ diffusion regions 105(n) and 105(n+1) are set at 5V and 0V respectively.

This produces hot electrons in a channel region in the surface of the P-type silicon substrate 101 between the N⁺ diffusion regions 105(n+1) and 105(n) and thereby causes electron injection in the floating gate 103a(n). The threshold voltage of the memory transistor MT(n) is thus increased to Vthp.

FIG. 18 is a cross-sectional view for explaining an erase operation on memory cells in a conventional flash memory. Referring to the drawing, the erase operation on the memory cells will be described hereinbelow. A plurality of memory transistors (e.g., all the memory transistors) are generally erased by one erase operation; in the present example, erasing of the memory transistors MT(n−3) to MT(n+3) is performed by one operation.

The erase operation is performed by applying a high negative voltage Ve2 (approximately −16 V) to the control gate 109 and grounding the P-type silicon substrate 101, the plurality of N⁺ diffusion regions 105 (105(n−3) to 105(n+3)), and the plurality of access gates 107a (107a(n−4) to 107a(n+3)).

Accordingly, electrons are emitted by a tunneling effect from the plurality of floating gates 103a (103a(n−3) to 103a(n+3)) to the P-type silicon substrate 101. This collectively reduces the threshold voltages of all the memory transistors MT(n−3) to MT(n+3) to Vthe.

Next, a read operation for reading out information stored in the memory transistor MT(n) will be set forth. This read operation is performed, for example, by applying 3.3 V to the control gate 109 and 1.0 V to the N⁺ diffusion region 105(n) and setting the N⁺ diffusion region 105(n+1) and the P-type silicon substrate 101 at 0V, the access gate 107a(n) at 3.3 V, and the access gates 107a(n−1) and 107a(n+1) at 0V.

Where Vthp>3.3 (V)>Vthe, the memory transistor MT(n), when in the written state, is off and no current flows between source and drain (between the N⁺ diffusion regions 105(n) and 105(n+1)), while when in the erased state, the memory transistor MT(n) is on and current flows between source and drain. By detecting the presence or absence of the current flow between source and drain, information stored in the memory transistor MT(n) can be read.

The conventional flash memory performs read/erase/write operations as above described. It, however, offers the following problems.

(1) To set the memory transistor MT(n) to a high threshold voltage Vthp in writing, the N⁺ diffusion region 105(n) is set at 5 V, the N⁺ diffusion region 105(n+1) at 0 V, the access gate 107a(n) at 2 V, and the access gates 107a(n−1) and 107a(n+1) at 0 V.

That is, the write operation on a desired memory transistor MT(n) imposes restrictions on the potential of the N⁺ diffusion region 105 of another memory transistor MT(n+1) adjacent to one side (n+1) of the memory transistor MT(n) and the potentials of the access gates 107a of two memory transistors MT(n+1) and MT(n−1) adjacent to both sides (n+1) and (n−1) of the memory transistor MT(n).

It is thus impossible to perform, simultaneously with the write operation for setting the memory transistor MT(n) to a high threshold voltage Vthp, write operations for setting the memory transistors MT(n−1) and MT(n+1) adjacent to the memory transistors MT(n) to a high threshold voltage Vthp.

The write operations on the memory transistors MT(n+1) and MT(n−1), therefore, have to be performed after the completion of the write operation on the memory transistor MT(n). This requires at least two write operations as above described to complete writing of all the memory transistors, thereby lengthening an entire write time for the flash memory.

(2) The erase operation is performed by electron emission from the floating gate 103a to the P-type silicon substrate 101 by the tunneling effect. This, however, requires the application of a relatively high negative voltage Ve2 (e.g., approximately −16 V) to the control gate 109 to achieve a desired erasing speed.

SUMMARY OF THE INVENTION

It is an object of the present invention to provide a nonvolatile semiconductor storage device capable of achieving a shortened write time and a reduced absolute value of the operating voltage at the time of erasing.

A first aspect of the present invention is directed to a method of writing of a nonvolatile semiconductor storage device. The nonvolatile semiconductor storage device includes a semiconductor substrate, a plurality of floating gates, a plurality of access gates, a plurality of diffusion regions, and a control gate. At least the surface of the semiconductor substrate is of a first conductivity type. The plurality of floating gates and the plurality of access gates are formed on an insulating film provided on the surface of the semiconductor substrate. The plurality of floating gates and the plurality of access gates are alternately formed adjacent to one another, with an insulating film sandwiched between each of the gates. The plurality of diffusion regions of a second conductivity type are selectively formed in the surface of the semiconductor substrate. The plurality of diffusion regions each are formed under a corresponding one of the plurality of floating gates and a corresponding one of the plurality of access gates to extend thereacross. The control gate is formed on an insulating film provided on the plurality of floating gates and the plurality of access gates. One memory transistor consists essentially of the control gate, a pair of adjacent ones of the plurality of diffusion regions, one of the plurality of floating gates which is formed on one of the pair of diffusion regions, and one of the plurality of access gates which is formed on the other one of the pair of diffusion regions. The method includes the following steps (a) to (d). The step (a) is to set the semiconductor substrate at a substrate potential. The step (b) is to set the control gate at a first potential higher than the substrate potential. The step (c) is to set the plurality of access gates at a second potential at which the surface of the semiconductor substrate under the plurality of access gates is not reversed to the second conductivity type. The step (d) is to set the one of the pair of diffusion regions in the one memory transistor at a third potential in a first write mode and to set the one of the pair of diffusion regions at a fourth potential that is shifted from the third potential toward the first potential in a second write mode. The first and third potentials include a potential at which electrons move from the one of the pair of diffusion regions to the one of the plurality of floating gates by a tunneling effect, and the first and fourth potentials include a potential at which substantially no electrons move from the one of the pair of diffusion regions to the one of the plurality of floating gates by the tunneling effect.

In the step (d), the threshold voltage of a memory transistor, when written in the first write mode, is increased by tunnel injection of electrons into the floating gate, whereas the threshold voltage of a memory transistor, when written in the second write mode, is maintained as-is without substantial tunnel injection of electrons into the floating gate. This achieves the write operation in which the contents of writing can be changed depending on the write mode, either "the first write mode" or "the second write mode".

Further, the step (c) is performed in order not to reverse the surface of the semiconductor device under the plurality of access gates to the second conductivity type. Since the plurality of diffusion regions are electrically isolated from one another, the write operation is not interfered even if the potentials of the plurality of diffusion regions are simultaneously set.

This allows writing of the plurality of memory transistors to be performed by one operation, thereby achieving a shortened write time.

A second aspect of the present invention is directed to a method of erasing of a nonvolatile semiconductor storage device. The nonvolatile semiconductor storage device includes a semiconductor substrate, a plurality of floating gates, a plurality of access gates, a plurality of diffusion regions, and a control gate. At least the surface of the semiconductor substrate is of a first conductivity type. The plurality of floating gates and the plurality of access gates are formed on an insulating film provided on the surface of the semiconductor substrate. The plurality of floating gates and the plurality of access gates are alternately formed adjacent to one another, with an insulating film sandwiched between each of the gates. The plurality of diffusion regions of a second conductivity type are selectively formed in the surface of the semiconductor substrate. The plurality of diffusion regions each are formed under a corresponding one of the plurality of floating gates and a corresponding one of the plurality of access gates to extend thereacross. The control gate is formed on an insulating film provided on the plurality of floating gates and the plurality of access gates. One memory transistor consists essentially of the control gate, a pair of adjacent ones of the plurality of diffusion regions, one of the plurality of floating gates which is formed on one of the pair of diffusion regions, and one of the plurality of access gates which is formed on the other one of the pair of diffusion regions. The method includes the following steps (a) to (d). The step (a) is to set the semiconductor substrate at a substrate potential. The step (b) is to set the control gate at a first potential lower than the substrate potential. The step (c) is to set the plurality of access gates at a second potential. The step (d) is to set all of the plurality of diffusion regions at a third potential. The first and third potentials include a potential at which electrons stored in the plurality of floating gates are emitted to the semiconductor substrate by a tunneling effect, and the second potential includes a potential that is shifted from the substrate potential toward the first potential.

The second potential which is the potential of the plurality of access gates is equivalent to a potential that is shifted from the substrate potential toward the first potential which is the control gate potential.

In this case, the two capacitances (adjacent access gate capacitances) formed between the floating gate and two adjacent access gates improves the ratio of the floating gate potential to the control gate potential. Consequently, the absolute value of the operating voltage at the time of erasing, which is determined by the control gate potential, is reduced by the amount of increase in the above ratio.

These and other objects, features, aspects and advantages of the present invention will become more apparent from the following detailed description of the present invention when taken in conjunction with the accompanying drawings.

DESCRIPTION OF THE PREFERRED EMBODIMENTS

<Preferred Embodiment>
(Configuration)

Figure 1:
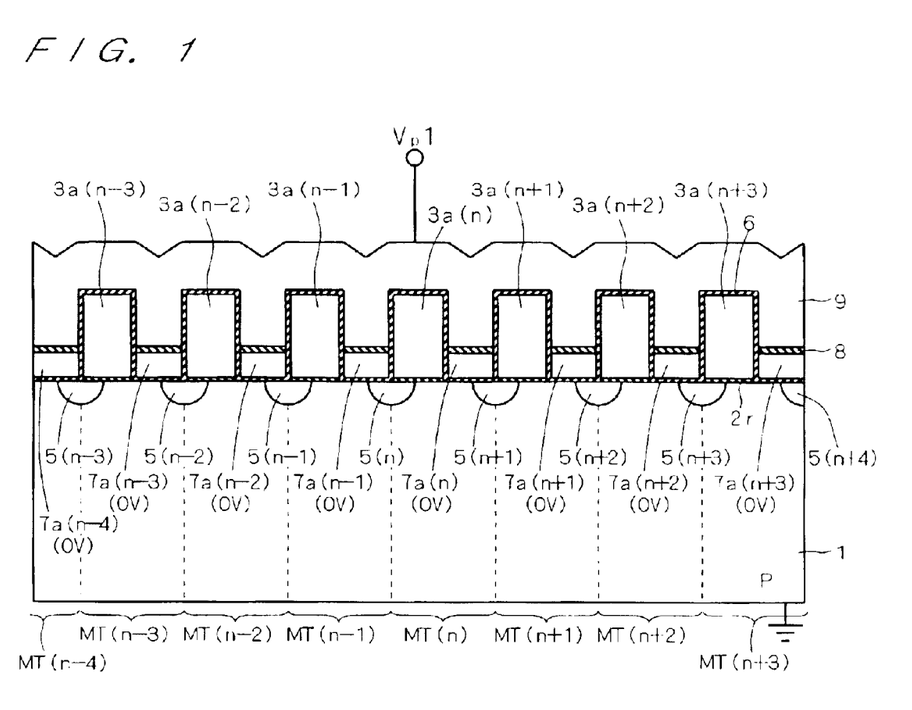
FIG. 1 is a cross-sectional view illustrating a configuration of a memory transistor group in a flash memory according to a preferred embodiment of the present invention.

FIG. 1 is a cross-sectional view illustrating a configuration of a group of memory transistors in a flash memory according to one preferred embodiment of the present invention. As shown, a plurality of N+ diffusion regions 5 (5(n−3) to 5(n+3)) are selectively formed in the surface of a P-type silicon substrate 1. On the surface of the P-type silicon substrate 1, a plurality of floating gates 3a (3a(n−3) to 3a(n+3)) are selectively formed with a silicon oxide film 2r sandwiched in between. Further, a plurality of access gates 7a (7a(n−4) to 7a(n+3)) are selectively formed on the surface of the P-type silicon substrate 1, with a three-layer insulating film 6, consisting of a silicon oxide film, a silicon nitride film, and a silicon oxide film, sandwiched in between.

A silicon oxide film 8 is formed on each of the plurality of access gates 7a, and the plurality of floating gates 3a are covered with the three-layer insulating film 6. Further, a control gate 9 is formed over the whole surface including the surfaces of the three-layer insulating film 6 and the silicon oxide film 8.

The plurality of floating gates 3a and the plurality of access gates 7a are alternately formed adjacent to one another, with the three-layer insulating film 6 sandwiched between each gate. The plurality of N+ diffusion regions 5 each are formed under a corresponding one of the plurality of floating gates 3a and a corresponding one of the plurality of access gates 7a to extend thereacross. Hereinbelow, this will be described in more detail.

The relative positions of the plurality of N+ diffusion regions 5, the plurality of floating gates 3a, and the plurality of access gates 7a can be described as follows. That is, where i is between (n−3) and (n+3), the N+ diffusion region 5(i) is formed under the access gate 7a(i−1) and the floating gate 3a(i) to extend thereacross.

More specifically, out of first (left-side) and second (right-side) areas of the surface of the N+ diffusion region 5(i), the access gate 7a(i−1) is formed on the first area with the three-layer insulating film 6 sandwiched in between and the floating gate 3a(i) is formed on the second area with the silicon oxide film 2r sandwiched in between.

(Circuit Configuration)

Figure 2:
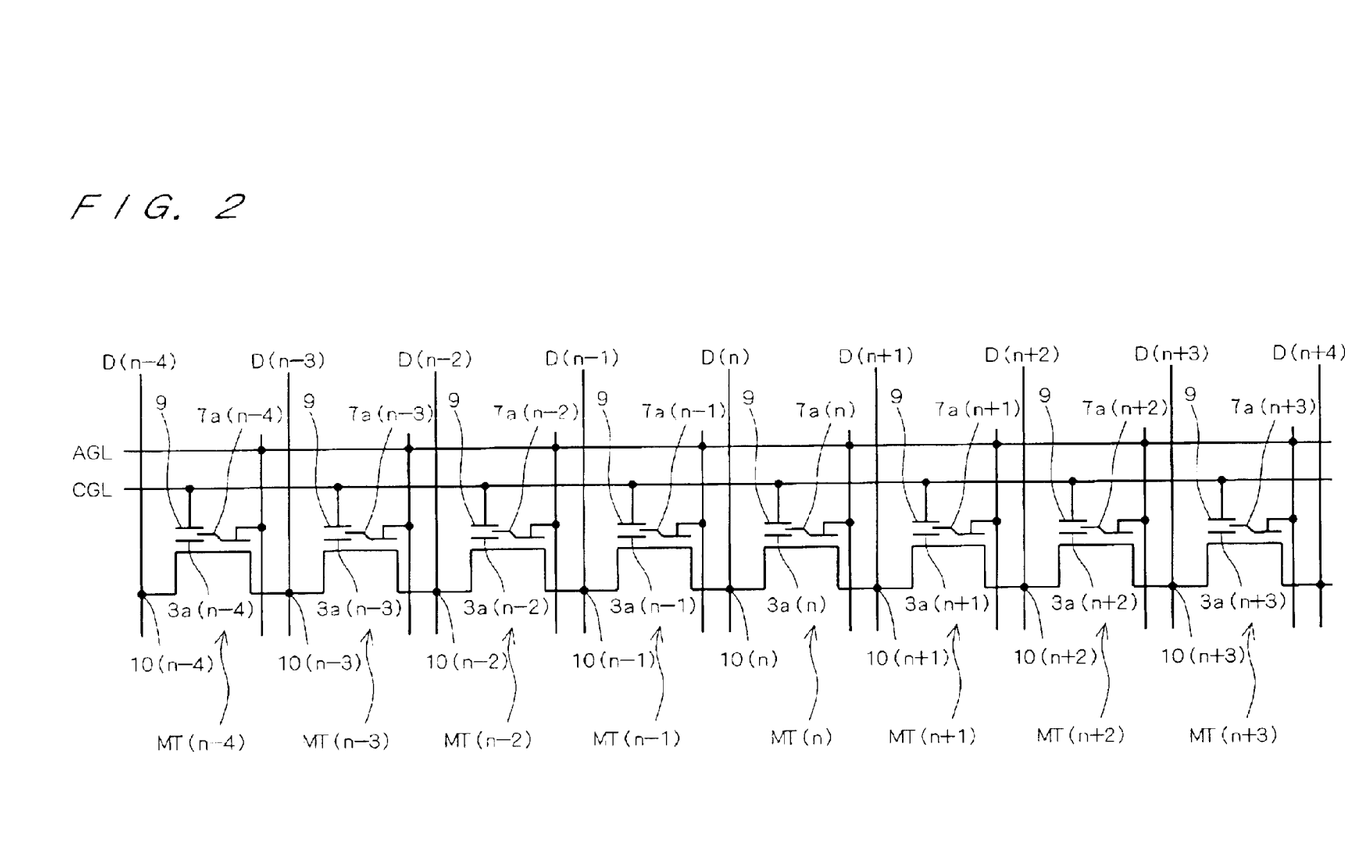
FIG. 2 is an equivalent circuit diagram of the memory transistor group shown in FIG. 1.

FIG. 2 is an equivalent circuit diagram of the group of memory transistors shown in FIG. 1. As shown, eight memory transistors MT(n−4) to MT(n+3) are formed in series. Where j is between (n−4) and (n+3), the memory transistor (j) is configured of the control gate 9, the floating gate 3a(j), and the access gate 7a(j). In FIG. 1, a floating gate 3a(n−4) of a memory transistor MT(n−4) and an N+ diffusion region 5(n−4) of FIG. 2 are not shown.

As shown in FIG. 2, the control gates 9 of the plurality of memory transistors MT(n−4) to MT(n+3) is electrically connected in common to a control gate line CGL, and the plurality of access gates 7a(n−4) to 7a(n+3) are electrically connected in common to an access gate line AGL. A terminal 10(j) (corresponding to the N+ diffusion region 5(j)) on the source side of the memory transistor MT(j) (on the floating gate 3a(j) side) is electrically connected to a data line D(j).

Such a configuration of the memory transistor group according to this preferred embodiment can be manufactured similarly to the conventional manufacturing method shown in FIGS. 6 to 13. The correspondence between FIG. 1 and FIGS. 6 to 13 is expressed in components as follows: the P-type silicon substrate 1 corresponds to the P-type silicon substrate 101; the silicon oxide films 2, 4, and 8 correspond respectively to the silicon oxide films 102r, 104, and 108; the floating gates 3a correspond to the floating gates 103a; the N+ diffusion regions 5 correspond to the N+ diffusion regions 105; the three-layer insulating film 6 corresponds to the three-layer insulating film 106; the access gates 7a correspond to the access gates 107a; and the control gate 9 corresponds to the control gate 109.

(Write Operation)

Referring now to FIGS. 1 and 2, a write operation according to this preferred embodiment will be described hereinbelow.

(a) Set the P-type silicon substrate 1 at a ground level (substrate potential);
(b) Apply a high voltage Vp1 (approximately 20 V) to the control gate line CGL to set the control gate 109 at the voltage Vp1; and
(c) Apply 0V to the access gate line AGL to set all the access gates 7a(n−4) to 7a(n+3) at 0 V.

Hereinafter, the execution of the steps (a) to (c) is referred to as writable mode settings.

In the writable mode settings, the threshold voltages of the memory transistors MT(n−4) to MT(n+3) are determined according to values on the corresponding data lines D(n−4) to D(n+3). In the present example, it is assumed that all the memory transistors MT(n−4) to MT(n+3) have been initialized to a low threshold voltage Vthe by an erase operation which will be described later.

When the memory transistor MT(n) is set into the written state (high threshold voltage Vthp) (i.e., in a first write mode), a voltage of 0V should be applied to the data line D(n) to set the N+ diffusion region 5(n) at 0 V in a step (d) following the above steps (a) to (c).

The N+ diffusion region 5(n) at 0 V produces an inversion layer that is at the same potential (0 V) as the N+ diffusion layer 5(n) in the surface of the P-type silicon substrate 1 directly below the floating gate 3a(n), thereby causing tunnel injection of electrons from the inversion layer and the N+ diffusion region 5(n) to the floating gate 3a(n). Accordingly, the threshold voltage of the memory transistor MT(n) is increased to Vthp.

When the memory transistor MT(n) is set into the erased state (low threshold voltage Vthe) (i.e., in a second write mode), on the other hand, a voltage of 6 V should be applied to the data line D(n) to set the N+ diffusion region (5n) at 6 V, in the above step (d).

The N+ diffusion region 5(n) at 6V produces an inversion layer that is at the same potential as the N+ diffusion region 5(n) in the surface of the P-type silicon substrate 1 directly under the floating gate 3a(n). However, potential differences among the inversion layer, the floating gate 3a(n), the N+ diffusion region 5(n) are smaller than those in the case of setting the N+ diffusion region 5(n) at 0 V; therefore the amount of electrons tunneling from the inversion layer and the N+ diffusion region 5(n) to the floating gate 3a(n) is negligible. A resultant write time for one write operation is thus about 1 msec, which allows the threshold voltage of the memory transistor MT(n) to be maintained at a low value Vthe without being increased.

Similarly, when the memory transistor MT(n+1) is set to a high threshold voltage Vthp (in the first write mode), a voltage of 0 V should be applied to the data line D(n+1) to set the N+ diffusion region 5(n+1) at 0 V in the step (d). When the memory transistor MT(n+1) is set to a low threshold voltage Vthe (in the second write mode), a voltage of 6 V should be applied to the data line D(n+1) to set the N+ diffusion region 5(n+1) at 6V in the step (d). The same applies to writing of the other memory transistors MT(n−4) to MT(n−1), MT(n+2), and MT(n+3).

In the writable mode settings, since all the access gates 7a(n−4) to 7a(n+3) are set at 0 V, the conductivity type of the surface of the P-type silicon substrate 1 under the access gates 7a(n−4) to 7a(n+3) is not reversed. That is, all the access gates 7a(n−4) to 7a(n+3) are set at a common potential in order not to reverse the conductivity type of the surface of the P-type silicon substrate 1 thereunder.

At this time, since all the access gates 7a(n–4) to 7a(n+3) are connected in common to the access gate line AGL, they can be set at 0 V by simply applying 0 V to the access gate line AGL.

Therefore, unless a punch-through effect intervenes, no electrical connection is established between two adjacent N⁺ diffusion regions 5 (e.g., between the N⁺ diffusion regions 5(n) and 5(n–1), between the N⁺ diffusion regions 5(n) and 5(n+1)). From this, individually setting the potentials of the N⁺ diffusion regions 5(n–4) to 5(n+3) brings about no adverse effect. That is, writing of one memory transistor can be performed without any adverse effect on the contents of writing of adjacent memory transistors.

As a result, the memory transistors MT (n–4) to MT(n+3) can be set to either a high threshold voltage Vthp or a low threshold voltage Vthe by simultaneously applying either 0 V or 6V to the data lines D(n–4) to D(n+3).

In this fashion, the flash memory according to this preferred embodiment can perform writing of each of the memory transistors MT(n–4) to MT(n+3) independently of the contents of writing of adjacent memory transistors and therefore, can perform writing of all the memory transistors (memory cells) by one operation, which results in the reduction in the write time.

(Erase Operation)

Figure 3:
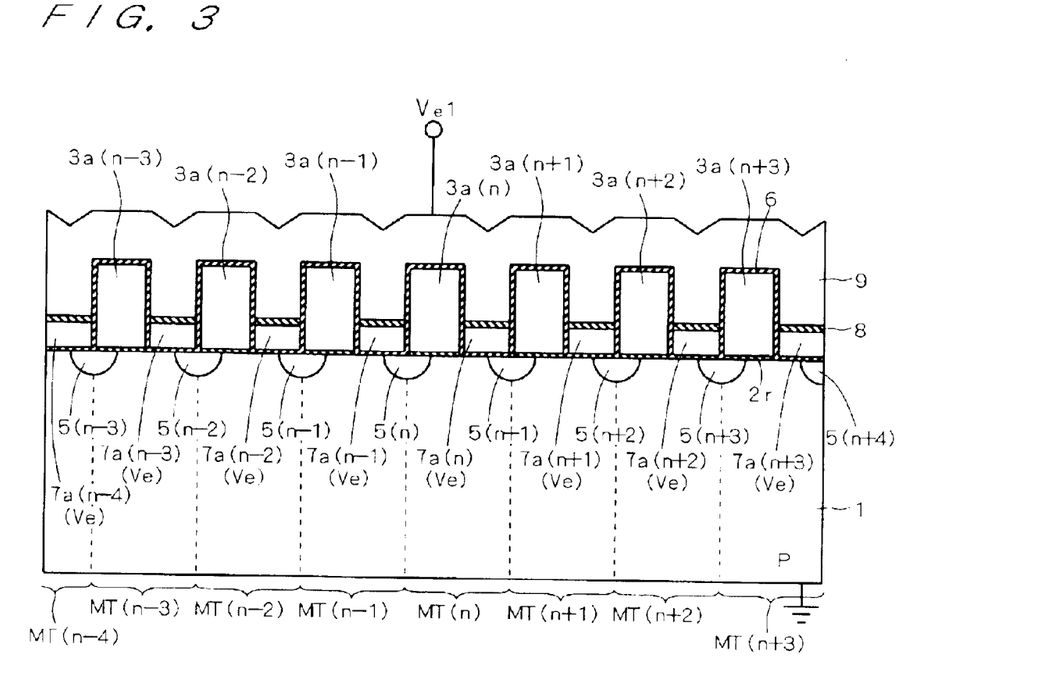
FIG. 3 is a cross-sectional view for explaining an erase operation on the flash memory according to the preferred embodiment.

FIG. 3 is a cross-sectional view for explaining an erase operation in the flash memory according to the preferred embodiment of the present invention. Referring to FIGS. 3 and 2, the erase operation will now be set forth. In FIG. 3, the floating gate 3a(n–4) of the memory transistor MT(n–4) and the N⁺ diffusion region 5(n–4) are not shown.

The erase operation is performed by the following potential settings:

(a) Set the P-type silicon substrate 1 at a ground level (substrate potential);
(b) Apply a high negative voltage Ve1 (approximately –10 V) to the control gate line CGL to set the control gate 109 at the voltage Ve1;
(c) Apply the high negative voltage Ve1 to the access gate line AGL to set all the access gates 7a(n–4) to 7a(n+3) at the voltage Ve1; and
(d) Set all the data lines D(n–4) to D(n+3) at "0"(0 V) to set the N⁺ diffusion regions 5(n–3) to 5(n+3) at 0 V.

This causes electron emission from all the floating gates 3a(n–4) to 3a(n+3) to the P-type silicon substrate 101 by a tunneling effect, thereby reducing the threshold voltages of the memory transistors MT(n–4) to MT(n+3). Accordingly, the transistors MT(n–4) to MT(n+3) are set into the erased state (a low threshold voltage Vthe).

At this time, since all the access gates 7a(n–4) to 7a(n+3) are set at the high negative voltage Ve1, the ratio of the control gate potential to the floating gate potential increases. As a result, the same erasing speed as achieved by the conventional erase operation, in which the high negative voltage Ve2 (approximately –16 V) is applied to the control gate 109, can be achieved in the erase operation of this preferred embodiment in which the absolute value of the high negative voltage Ve1 applied to the control gate 9 is lower than that of the high negative voltage Ve2.

Further, higher-speed erasing is possible if, in the erase operation of this preferred embodiment, the higher negative voltage Ve2 is applied to the control gate 9 instead of applying the negative voltage Ve1.

Figure 4:
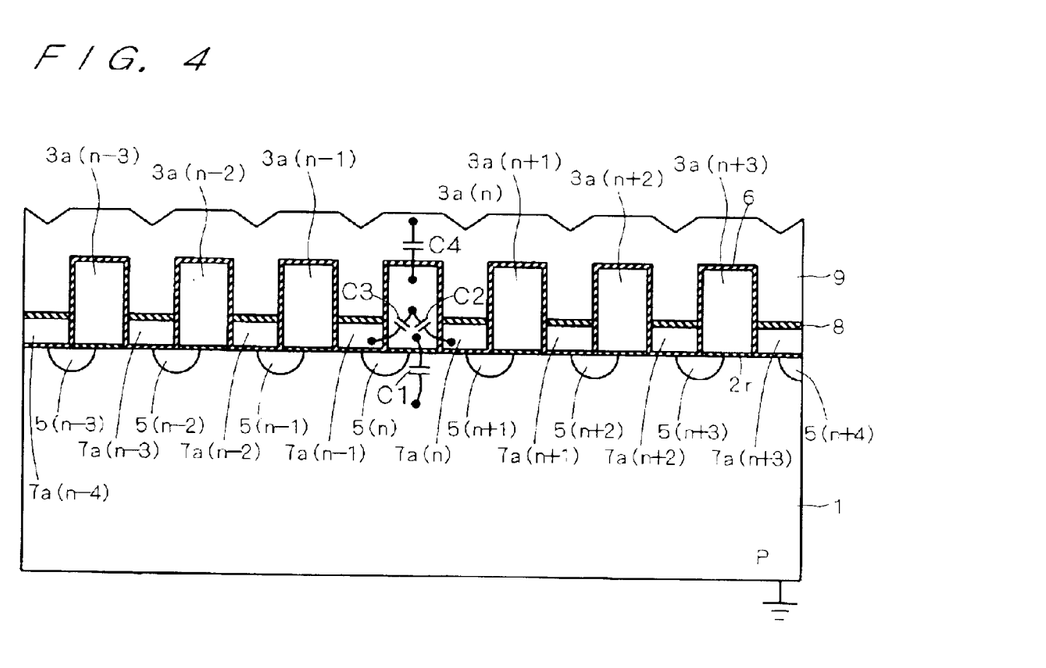
FIG. 4 is an explanatory diagram of capacitances accompanying a floating gate.

FIG. 4 is an explanatory diagram of capacitances accompanying the floating gate. As shown, the floating gate 3a(n) has a capacitance C1 formed between itself and the p-type silicon substrate 1, a capacitance C2 formed between itself and the access gate 7a(n) on the right side, a capacitance C3 formed between itself and the access gate 7a(n–1) on the left side, and a capacitance C4 formed between itself and the control gate 9.

Where $V_{SUB}$ is the substrate potential of the P-type silicon substrate 1, $V_{CG}$ is the potential of the control gate 9, $V_{FG}$ is the potential of the floating gate 3a(n), $V_{LG}$ is the potential of the access gate 7a(n–1), and VRG is the potential of the access gate 7a(n), the charge QFG on the floating gate 3a(n) is found by the following equation:

$$\begin{aligned}Q_{FG} &= C1(V_{SUB} - V_{FG}) + C2(V_{RG} - V_{FG}) + \\ &\quad C3(V_{LG} - V_{FG}) + C4(V_{CG} - V_{FG}) \\ &= C1 \cdot V_{SUB} + C2 \cdot V_{RG} + C3 \cdot V_{LG} + \\ &\quad C4 \cdot V_{CG} - (C1 + C2 + C3 + C4) \cdot V_{FG}\end{aligned} \quad (1)$$

Since $V_{SUB}=0V$, $V_{LG}=V_{RG}=0V$, and $V_{CG}=$Ve(Ve1, Ve2) in conventional methods of erasing, Equation (1) can be transformed into the following equation:

$$Q_{FG}=C4 \cdot Ve-(C1+C2+C3+C4) \cdot V_{FG} \quad (2)$$

Assuming that the charge $Q_{FG}$ on the floating gate 3a(n) is electrically neutral ("0") and CT=C1+C2+C3+C4, the potential $V_{FG}$ of the floating gate 3a(n) can be expressed by the following equation:

$$V_{FG} = \frac{C4}{CT} \cdot Ve \quad (3)$$

On the other hand, since $V_{SUB}=0V$, $V_{LG}=V_{RG}=$Ve, and $V_{CG}=$Ve in the method of erasing according to this preferred embodiment, Equation (1) can be transformed into the following equation:

$$0=(C2+C3+C4) \cdot Ve-(C1+C2+C3+C4) \cdot V_{FG} \quad (4)$$

Assuming that the charge $Q_{FG}$ on the floating gate 3a(n) is electrically neutral ("0") and CT=C1+C2+C3+C4, as in the case of transforming Equation (2) into Equation (3), the potential $V_{FG}$ of the N⁺ diffusion region 5(n) can be expressed by the following equation:

$$V_{FG} = \frac{C2 + C3 + C4}{CT} \cdot Ve \quad (5)$$

A comparison of Equations (3) and (5) shows that, even with the same high negative voltage Ve applied the control gate voltage $V_{CG}$, the erasing method according to this preferred embodiment can obtain a larger absolute value of the floating gate potential $V_{FG}$ than the conventional ones.

Accordingly, even if the absolute value of the potential of the control gate 9 is reduced to the high negative voltage Ve1 from the conventional one Ve2, the erase operation equivalent to that in the conventional methods can be performed. That is, the flash memory according to this preferred embodiment can reduce the absolute value of the operating voltage at the time of erasing.

(Read Operation)

Figure 5:
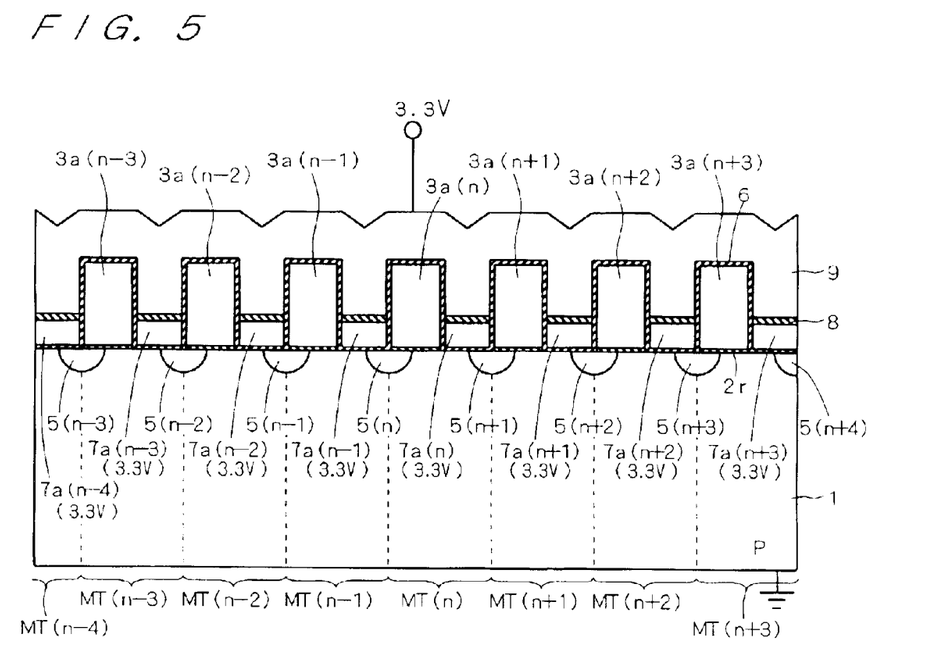
FIG. 5 is a cross-sectional view for explaining a read operation on the flash memory according to the preferred embodiment.

FIG. 5 is a cross-sectional view for explaining a read operation in the flash memory according to the preferred embodiment of the present invention. Referring to FIGS. 5 and 2, the read operation will now be set forth.

In the read operation, the P-type silicon substrate 1 is grounded, the control gate line CGL and the access gate line AGL are both set at 3.3 V, and the control gate 9 and all the access gates 7a(n−4) to 7a(n+3) are set at 3.3 V. Hereinafter, this potential settings are referred to as readable mode settings.

Herein, a read operation for reading out information stored in the memory transistor MT(n) will be described. In the readable mode settings, a voltage of 1.0 V is applied to the data lines D(n+1) to D(n+4) and a voltage of 0 V is applied to the data lines D(n−4) to D(n), thereby to set the N$^+$ diffusion regions 5(n+1) to 5(n+4) at 1.0 V and the N$^+$ diffusion regions 5(n−4) to 5(n) at 0 V. Under the access gates 7a at 3.3 V, the conductivity type of the surface of the P-type silicon substrate 1 is reversed.

Where Vthp>3.3 (V)>Vthe, the memory transistor MT(n), when in the written state (at a high threshold voltage Vthp), is off and no current flows between source and drain (between the N$^+$ diffusion regions 5(n) and 5(n+1)), whereas when in the erase state (at a low threshold voltage Vthe), the memory transistor MT(n) is on and current flows between source and drain. By detecting the presence or absence of the current flow between source and drain, information stored in the memory transistor MT(n) can be read.

Even if any of the memory transistors MT(n+1) to MT(n+3) is in the on state at the time of reading of the memory transistor MT(n), since the potentials of the N$^+$ diffusion regions 5(n+2) to 5(n+4) are set at 1.0 V, the potential of the N$^+$ diffusion region 5(n+1) on the drain side of the memory transistor MT(n) never changes from 1.0 V. Similarly, even if any of the memory transistors MT(n−1) to MT(n−4) is in the on state at the time of reading of the memory transistor MT(n), since the potentials of the N$^+$ diffusion regions 5(n−1) to 5(n−4) are set at 0 V, the potential of the N$^+$ diffusion region 5(n) on the source side of the memory transistor MT(n) never changes from 0V. That is, the reading of the memory transistor MT(n) is not interfered in either case.

(Modification)

While in the configuration of this preferred embodiment, all the access gates 7a are connected in common to the access gate line AGL, the method of writing/erasing according to this preferred embodiment is also applicable to such a configuration that the potentials of the access gates 7a are determined on an individual basis or in units of two or more groups of access gates 7a.

While the invention has been shown and described in detail, the foregoing description is in all aspects illustrative and not restrictive. It is therefore understood that numerous modifications and variations can be devised without departing from the scope of the invention.

What is claimed is:

1. A method of writing of a nonvolatile semiconductor storage device, said nonvolatile semiconductor storage device comprising:

a semiconductor substrate, at least the surface of which is of a first conductivity type;

a plurality of floating gates and a plurality of access gates formed on an insulating film provided on the surface of said semiconductor substrate, said plurality of floating gates and said plurality of access gates being alternately formed adjacent to one another, with an insulating film sandwiched between each of said gates;

a plurality of diffusion regions of a second conductivity type selectively formed in the surface of said semiconductor substrate, said plurality of diffusion regions each being formed under a corresponding one of said plurality of floating gates and a corresponding one of said plurality of access gates to extend thereacross; and a control gate formed on an insulating film provided on said plurality of floating gates and said plurality of access gates, wherein one memory transistor consists essentially of said control gate, a pair of adjacent ones of said plurality of diffusion regions, one of said plurality of floating gates which is formed on one of said pair of diffusion regions, and one of said plurality of access gates which is formed on the other one of said pair of diffusion regions, said method comprising the steps of:

(a) setting said semiconductor substrate at a substrate potential;

(b) setting said control gate at a first potential higher than said substrate potential;

(c) setting said plurality of access gates at a second potential at which the surface of said semiconductor substrate under said plurality of access gates is not reversed to said second conductivity type; and (d) writing onto at least a pair of adjacent ones of said memory transistors under said control gate, in a first write mode, to set said one of said pair of diffusion regions in said one memory transistor at a third potential and in a second write mode, to set said one of said pair of diffusion regions at a fourth potential that is shifted from said third potential toward said first potential, wherein said first and third potentials include a potential at which electrons move from said one of said pair of diffusion regions to said one of said plurality of floating gates by a tunneling effect, and said first and fourth potentials include a potential at which substantially no electrons move from said one of said pair of diffusion regions to said one of said plurality of floating gates by the tunneling effect.

2. The method of writing of a nonvolatile semiconductor storage device according to claim 1, wherein said nonvolatile semiconductor storage device further comprises:

an access gate line electrically connected in common to said plurality of access gates, and said step (c) includes the step of applying said second potential to said access gate line.

3. A method of erasing of a nonvolatile semiconductor storage device, said nonvolatile semiconductor storage device comprising:

a semiconductor substrate, at least the surface of which is of a first conductivity type;

a plurality of floating gates and a plurality of access gates formed on an insulating film provided on the surface of said semiconductor substrate, said plurality of floating gates and said plurality of access gates being alternately formed adjacent to one another, with an insulating film sandwiched between each of said gates;

a plurality of diffusion regions of a second conductivity type selectively formed in the surface of said semiconductor substrate, said plurality of diffusion regions each being formed under a corresponding one of said plurality of floating gates and a corresponding one of said plurality of access gates to extend thereacross; and a control gate formed on an insulating film provided on said plurality of floating gates and said plurality of access gates, wherein one memory transistor consists essentially of said control gate, a pair of adjacent ones of said plurality of diffusion regions, one of said plurality of floating gates which is formed on one of said pair of diffusion regions, and one of said plurality of access gates which is formed on the other one of said pair of diffusion regions, said method comprising the steps of:
(a) setting said semiconductor substrate at a substrate potential;
(b) setting said control gate at a first potential lower than said substrate potential;
(c) setting said plurality of access gates at a second potential; and
(d) setting said plurality of diffusion regions that are subject to erasure at a third potential, wherein said first and third potentials include a potential at which electrons stored in said plurality of floating gates are emitted to said semiconductor substrate by a tunneling effect, said second potential includes a potential that is shifted from said substrate potential toward said first potential.

4. The method according to claim 3, wherein said nonvolatile semiconductor storage device further comprises:
an access gate line electrically connected in common to said plurality of access gates, and
said step (c) includes the step of applying said second potential to said access gate line.

5. The method according to claim 4, wherein said second potential includes a potential at the same level as said first potential, and said third potential includes said substrate potential.

6. The method according to claim 3, wherein said second potential includes a potential at the same level as said first potential, and said third potential includes said substrate potential.

* * * * *